United States Patent [19]
Franke et al.

[11] Patent Number: 5,378,316
[45] Date of Patent: Jan. 3, 1995

[54] HIGH DURABILITY MASK FOR DRY ETCH PROCESSING OF GAAS

[75] Inventors: Hans-George Franke, Hilton; Eric T. Prince, Fairport, both of N.Y.

[73] Assignee: Eastman Kodak Company, Rochester, N.Y.

[21] Appl. No.: 1,432

[22] Filed: Jan. 7, 1993

Related U.S. Application Data

[63] Continuation of Ser. No. 679,843, Apr. 3, 1991, abandoned.

[51] Int. Cl.⁶ .............................................. H01L 21/00
[52] U.S. Cl. ............................... 156/659.1; 156/662; 156/643; 156/646
[58] Field of Search .................... 156/659.1, 643, 646, 156/668, 662

[56] References Cited

U.S. PATENT DOCUMENTS

| | | | |
|---|---|---|---|
| 4,436,797 | 3/1984 | Brady et al. | 204/192.15 |
| 4,640,737 | 2/1987 | Nagasaka et al. | 156/662 |
| 4,837,182 | 6/1989 | Bozler et al. | 437/174 |
| 4,860,276 | 8/1989 | Ukita et al. | 369/119 |

FOREIGN PATENT DOCUMENTS

| | | |
|---|---|---|
| 58-212136 | 12/1983 | Japan . |
| 60-278179 | 12/1985 | Japan . |
| 62-136820 | 6/1987 | Japan . |

OTHER PUBLICATIONS

"Amorphous Carbon Films As Resist Mask With High Reactive Ion Etching Resistance For Nanometer Lithography"; *Appl. Phys. Lett.:* 48(13); 31 Mar. 1986; pp. 835–837; Kakuchi et al.

G. Oehrlein in Section 8.4 of "Reactive Ion Etching," *Handbook of Plasma Processing Technology*, Noyen Publication (1990).

Phillip C. Johnson, "The Cathodic Arc Plasma Deposition of Thin Films," Physics of Thin film, vol. 14, pp. 161 (Section 4, first paragraph), and 162 (first full paragraph), Academic Press 1989.

Coburn, "Pattent Transfer," *Solid State Technology*, Apr. 1986, pp. 117–122.

*Primary Examiner*—R. Bruce Breneman
*Assistant Examiner*—George Goudreau
*Attorney, Agent, or Firm*—Raymond L. Owens; Patent Dept., Eastman Kodak Co.

[57] ABSTRACT

A mask is described which enables the fabrication of features in GaAs such as waveguides, channels, facets, mesas, and mirrors by dry etch processing in chlorine containing ambients. The mask consists of an amorphous form of carbon which may contain incorporated hydrogen. The mask can be applied, patterned and removed through dry processing techniques.

3 Claims, 3 Drawing Sheets

HIGH DURABILITY MASK FOR DRY ETCH PROCESSING OF GAAS

This is a continuation of application Ser. No. 679,843, filed Apr. 3, 1991; now abandoned.

FIELD OF THE INVENTION

This invention relates to the protection of desired regions of GaAs by a durable mask during dry etch processing. More specifically, this invention relates to the use of a highly durable etch mask to protect desired regions of GaAs during the fabrication of features such as waveguides, channels, facets, mesas, and mirrors by dry etch processing in chlorine containing ambients.

BACKGROUND OF THE INVENTION

Fabrication of opto-electronic devices in GaAs requires the use of etch processes to produce features for both microoptical and microelectronic components. GaAs as used herein includes all compounds, crystalline and polycrystalline, containing gallium and arsenic with or without additional elements. Examples of features which are transferred into GaAs by etch processes include components such as waveguides, channels, facets, mesas and mirrors. To prepare components of this type having small, often sub-micron size dimensions, etch processes which provide a high degree of anisotropy are required. Wet etch techniques are, in general, unsuitable. Etch rates in wet processes are either isotropic or dependent on crystallographic orientation. Dry etch techniques, on the other hand, can avoid the dependence in rate (under optimum conditions) to crystallographic orientation and can provide the anisotropy required.

The majority of dry techniques used to provide an anisotropic etch in GaAs are ion-based processes which utilize chemistry to provide some form of reactive assistance. The most common techniques of this type include: Reactive Ion Etching (RIE), Reactive Ion Beam Etching (RIBE), and Ion Beam Assisted Etching (IBAE) [also known as Chemically-Assisted Ion Beam Etching (CAIBE)]. The chemistry utilized by these techniques for reactive assistance enhances etch rates, forms volatile etch products, and minimizes damage to the GaAs surface by energetic ions, neutrals, and/or radicals. In the dry etch processing of GaAs, ambients containing chlorine (atoms, molecules, neutrals, radicals) have been found most useful for providing suitable reactive assistance.

Some form of mask is required to protect desired regions of a substrate when using dry techniques to etch GaAs. Durable masks are often of particular value. The term "durable" as used herein defines the resistance of the mask to erosion during an etch process. An ideal mask is durable to the extent that it will not erode or change form during an etch process. For a mask to exhibit significant durability in the dry etch processing of GaAs, the ratio of the etch rate of the GaAs to that of the mask, i.e., the selectivity of the etch, must be high. Masks of materials of low durability are unsuitable for several reasons. First, the edge quality of etch features decreases as mask thickness increases. Second, mask features of dimensions smaller than the thickness of the mask are unstable and can break away or shift position during processing. Finally, mask erosion especially of edges can redeposit mask material into unwanted regions and degrade overall etch quality and uniformity.

In the dry etching of GaAs using chlorine for chemical assistance, few materials are known which when applied as thin layers (ca. 0.1 micron) offer the durability to survive an etch of from a few to many microns. Metals such as nickel (with titanium underlayer) and chromium and salts such as aluminum fluoride and strontium fluoride have been used with varying degrees of success. Wet techniques are frequently required to follow the dry etch processes to effect complete removal of these materials. What are needed are masks of high durability which are convenient to apply, pattern, and remove.

SUMMARY OF THE INVENTION

An object of this invention is to provide a durable mask for the dry etch processing of GaAs in chlorine containing ambients. Quite unexpectedly, we have discovered that a mask formed of amorphous carbon is highly resistant to attack by chlorine during dry etch processing in chlorine containing ambients. The amorphous carbon can be applied and removed by dry processing techniques.

A feature of this invention is that no wet etch steps are required following lithographic patterning.

Another feature is that the amorphous carbon mask facilitates the fabrication of features such as waveguides, channels, facets, mesas, and mirrors by dry etch processing in chlorine containing ambients.

DETAILED DESCRIPTION OF THE PREFERRED EMBODIMENTS

A mask of amorphous carbon can be prepared by a plasma-assisted CVD technique, i.e., by the decomposition of methane in an rf plasma. Other hydrocarbons may be substituted for methane and a wide range of process conditions may be used. Alternative techniques for depositing this material may be used as well. These include variations of the plasma-assisted CVD technique, glow discharge (rf and dc) sputter deposition, single and dual ion beam sputter deposition, reactive ion beam deposition, evaporation, and ion plating. Depending on the deposition technique selected, the chemical and physical properties of the carbon mask may vary; the chemical properties from amorphous carbon (a-C) to hydrogenated amorphous carbon (a-C:H), the physical properties from diamond-like to graphite-like.

Amorphous carbons which serve as highly durable masks are determined easily through routine examination using, for example, scanning electron microscopy (SEM), and experiments such as those described in subsequent Examples I and II. To be considered highly durable, the ratio of the etch rate of GaAs to that of the mask should exceed 10:1 and more typically, 25–50:1. The ambient under which this durability is established may include chlorine containing gases or gas mixtures other than those given by the examples, e.g. $BCl_3$, $BCl_3/Ar$, etc., as long as the ambient is a suitable ambient for the dry etching Of GaAs.

Figure 1A:
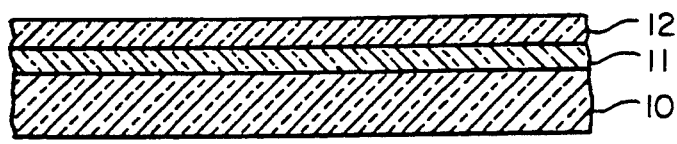
FIGS. 1 ($a-k$) are sectional views illustrating various steps in the preferred method of forming and removing the highly durable mask resistant to attack by chlorine.
Figure 1B:
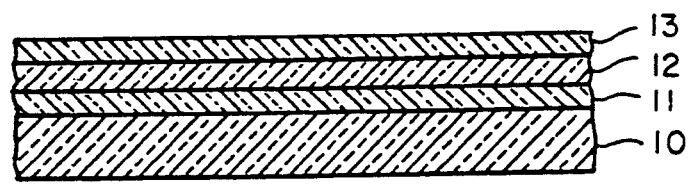
Figure 1C:
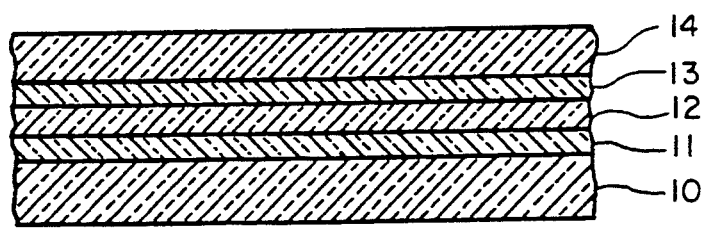
Figure 1D:
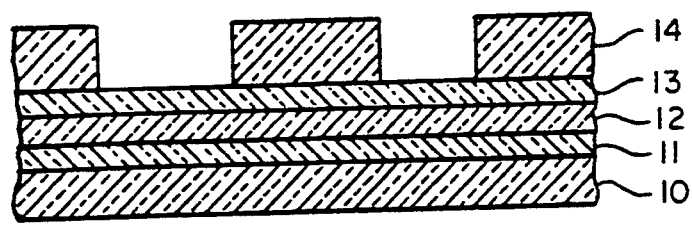
Figure 1E:
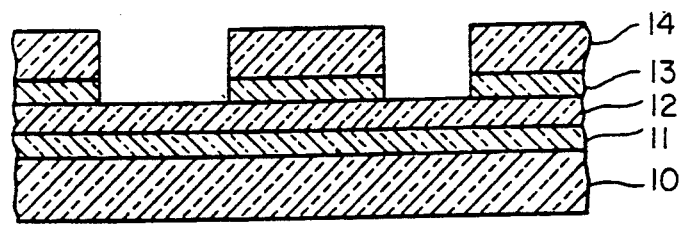
Figure 1F:
Figure 1G:
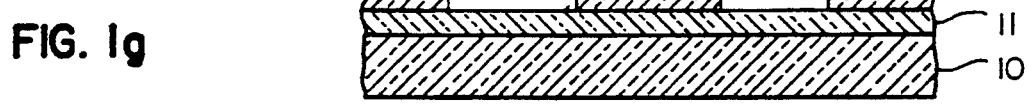
Figure 1H:
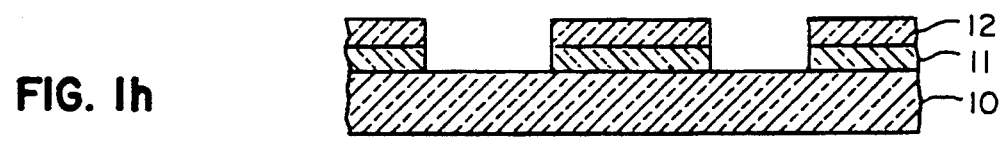
Figure 1I:
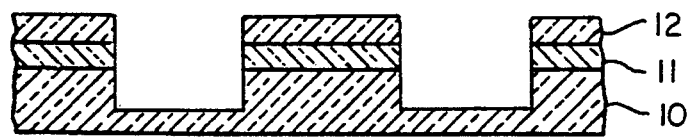
Figure 1J:
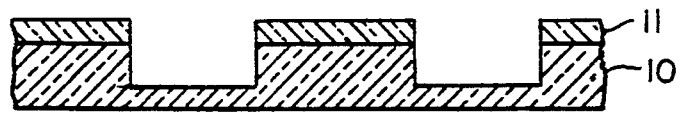
Figure 1K:

As shown in FIG. 1$a$, a layer of amorphous carbon 12 is deposited on a substrate 10 of GaAs which may or may not contain an overcoating 11 of a material such as SiO$_2$, Si$_3$N$_4$ or amorphous silicon. An amorphous material is preferred for layer 11 to prevent transfer of grain boundary features. This overlayer, when present, provides an adhesion layer for the amorphous carbon and protects the surface of the GaAs from damage by ion bombardment during the deposition of the amorphous carbon. As shown in FIG. 1b, a thin layer 13 of a material such as SiO$_2$, Si$_3$N$_4$, or amorphous silicon, is applied over the amorphous carbon layer. Again, an amorphous material is preferred for this layer to prevent transfer of grain boundary features. A layer 14 of a lithographically patternable material, e.g., photoresist or an electron beam sensitive resist, is then applied to the surface layer 13 as shown in FIG. 1c. Layer 14 is then exposed and developed according to accepted practices to provide a pattern as shown in FIG. 1d. Next a Reactive Ion Etch (RIE) step is used with an appropriate gas chemistry to selectively etch layer 13 through the exposed regions of the pattern in layer 14 as shown in FIG. 1e. Alternative dry etch techniques may be substituted for any of the RIE steps specified in this description whenever convenient. If layer 13 is composed of SiO$_2$ or amorphous silicon a freon/oxygen mixture such as CF$_4$/O$_2$ (96 vol % CF$_4$, 4 vol % O$_2$) can be used to selectively remove this layer by RIE. Another dry etch by RIE is then performed using oxygen (O$_2$) to selectively transfer the mask pattern in layer 13 through the amorphous carbon layer 12 to provide openings. This etch may also be used to remove the lithographically patternable layer 14 (FIG. 1f). The sample is then dry etched by RIE using a suitable selective gas to remove the remaining layer 13 pattern (FIG. 1g). By proper choice of materials this RIE step can also be useful for patterning layer 11 when present (FIG. 1h). At this point, the processing of the amorphous carbon mask with patterned openings which expose the GaAs substrate is complete and the wafer is ready for dry etching in a chlorine containing ambient. Following transfer of the pattern into GaAs (FIG. 1i), the amorphous carbon layer 12 is removed by RIE in O$_2$ (FIG. 1j). Finally, the adhesion/protection layer 11 when present is removed by RIE under the same conditions used during pattern transfer (FIG. 1k).

EXAMPLES

Two examples are presented here to illustrate the durability of amorphous carbon masks in the dry etch processing of GaAs in chlorine containing ambients using RIE and CAIBE. For convenience reasons only, the means used to pattern the amorphous carbon in these examples deviate from the means described in the preferred embodiment. Also, the anisotropy of the etch was of no concern in the first example. RIE conditions are presented which do not optimize this aspect.

I. In the first example an amorphous carbon layer of thickness 1.38μ was deposited onto an evaporated SiO$_2$ adhesion/protection layer of thickness 0.34μ on a GaAs substrate. The amorphous carbon was deposited by the plasma-assisted CVD technique onto an rf powered electrode at a self-bias voltage of 1600 V and a methane pressure of 16 mTorr. Photoresist was applied and patterned for application of an Imidazole-based photoresist lift-off process. After preparation of the appropriate photoresist profile for the lift-off process aluminum was deposited to a thickness of 0.1μ over the profile. The resultant lift-off pattern of aluminum on the amorphous carbon surface was then transferred through the amorphous carbon layer by RIE at 300 W in O$_2$ at a pressure of 40 mTorr. RIE was again used to transfer the pattern through the SiO$_2$ adhesion/protection layer at 300 W in CF$_4$/O$_2$ (96 vol % CF$_4$, 4 vol % O$_2$) at a pressure of 100 mTorr. A wet etchant was next used to strip the aluminum from the sample. Features to depths of 13.3μ were dry etched through openings in the amorphous carbon and SiO$_2$ mask layers into the GaAs substrate by RIE at 330 W in Cl$_2$/Ar (25 vol % Cl$_2$, 75 vol % Ar) at a pressure of 40 mTorr. Under these conditions the selectivity, i.e., the ratio of etch rate of the GaAs to that of the amorphous carbon, was found to exceed 100/1 (109/1 actual). RIE at 300 W in O$_2$ at 40 mTorr was used to remove the remaining amorphous carbon and RIE at 300 W in CF$_4$/O$_2$ (96 vol % CF$_4$, 4 vol % O$_2$) at 100 mTorr was used to remove the SiO$_2$ adhesion/protection layer.

II. In the second example an amorphous carbon layer of thickness 0.17μ was deposited onto an SiO$_2$ adhesion/protection layer of thickness 0.27μ on a GaAs substrate (actually a GaAs/AlGaAs double heterostructure containing substrate). The amorphous carbon was deposited by the plasma-assisted CVD technique, this time at a self-bias voltage of 400 V and a methane pressure of 1 mTorr. The same procedure which was followed to pattern the amorphous carbon in the first example was followed to pattern the amorphous carbon in this example. Using the CAIBE technique, features to depths of 8.46μ were dry etched through openings in the amorphous carbon and SiO$_2$ mask layers into the GaAs/AlGaAs double heterostructure substrate using 500 V Ar ions at a current density of 0.4 ma/cm$^2$. The flow of Ar into the Kaufman type ion source was 3 sccm. Cl$_2$ gas was directed at near normal incidence to the sample during etching at a flow of 12.5 sccm. The chamber pressure during etching was maintained at 6×10E-5 Torr. The base pressure of the chamber before etching was allowed to reach 5×10E-7 Torr. The ratio of the etch rate of the GaAs (including the GaAs/AlGaAs double heterostructure) to that of the amorphous carbon in this example was greater than 90/1. The amorphous carbon and the SiO$_2$ adhesion/protection layers were both removed by RIE as described above for the first example. The anisotropy achieved during this etch was excellent.

The invention has been described in detail with particular reference to certain preferred embodiments thereof, but it will be understood that variations and modifications can be effected within the spirit and scope of the invention.

What is claimed is:

1. A method of forming a highly durable mask and using such mask in the dry etch processing of GaAs, comprising the steps of:
    (a) providing a layer of amorphous carbon over the GaAs which is resistant to attack by chlorine on GaAs;
    (b) forming openings in the amorphous carbon layer to expose the GaAs layer by dry processing to form an amorphous mask;
    (c) dry etch processing of the GaAs in chlorine containing ambients through the opening in the mask; and
    (d) removing the mask.

2. The method of claim 1 wherein the amorphous carbon contains incorporated hydrogen.

3. The method of claim 1 wherein the mask is removed by dry processing.

* * * * *